(12) United States Patent
Watabe et al.

(10) Patent No.: US 10,488,569 B2
(45) Date of Patent: Nov. 26, 2019

(54) DISPLAY DEVICE

(71) Applicant: Japan Display Inc., Minato-ku (JP)

(72) Inventors: Kazufumi Watabe, Minato-ku (JP);
Hiroshi Kawanago, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 15/828,458

(22) Filed: Dec. 1, 2017

(65) Prior Publication Data
US 2018/0203169 A1 Jul. 19, 2018

(30) Foreign Application Priority Data

Jan. 17, 2017 (JP) ................................ 2017-005746

(51) Int. Cl.

| | | |
|---|---|---|
| *G02B 5/20* | (2006.01) | |
| *G02F 1/1335* | (2006.01) | |
| *G02F 1/1333* | (2006.01) | |
| *H01L 27/12* | (2006.01) | |
| *H01L 29/786* | (2006.01) | |
| *H01L 21/428* | (2006.01) | |
| *H01L 27/32* | (2006.01) | |
| *G02B 5/26* | (2006.01) | |
| *G02F 1/1368* | (2006.01) | |
| *H01L 51/00* | (2006.01) | |

(52) U.S. Cl.
CPC .............. *G02B 5/208* (2013.01); *G02B 5/26* (2013.01); *G02F 1/133305* (2013.01); *G02F 1/133509* (2013.01); *H01L 21/428* (2013.01); *H01L 27/127* (2013.01); *H01L 27/1218* (2013.01); *H01L 27/1225* (2013.01); *H01L 27/1262* (2013.01); *H01L 27/3272* (2013.01);

*H01L 29/7869* (2013.01); *H01L 29/78603* (2013.01); *G02F 1/1368* (2013.01); *G02F 2001/13685* (2013.01); *G02F 2203/11* (2013.01); *H01L 27/3262* (2013.01); *H01L 51/0097* (2013.01)

(58) Field of Classification Search
None
See application file for complete search history.

(56) References Cited

U.S. PATENT DOCUMENTS

| | | | | |
|---|---|---|---|---|
| 6,327,006 | B1 * | 12/2001 | Sato | G02F 1/136209 349/43 |
| 2005/0029521 | A1 * | 2/2005 | Yamasaki | G02F 1/136213 257/72 |
| 2005/0082540 | A1 * | 4/2005 | Nishikawa | H01L 27/3262 257/72 |
| 2008/0100566 | A1 * | 5/2008 | Miyasaka | G09G 3/3446 345/107 |

(Continued)

FOREIGN PATENT DOCUMENTS

| | | |
|---|---|---|
| JP | 2011-54812 | 3/2011 |
| JP | 2013-175718 | 9/2013 |

*Primary Examiner* — Michelle Mandala
*Assistant Examiner* — Jordan M Klein
(74) *Attorney, Agent, or Firm* — Oblon, McClelland, Maier & Neustadt, L.L.P.

(57) ABSTRACT

The purpose of the present invention is to realize a flexible display includes a resin substrate and a TFT having an oxide. The structure of the invention is as follows. A display device comprising: a substrate formed by resin, an inorganic insulating film and a thin film transistor including a semiconductor, wherein an infra-red light reflecting film is formed between the substrate and the thin film transistor.

10 Claims, 19 Drawing Sheets

(56) References Cited

U.S. PATENT DOCUMENTS

| | | | |
|---|---|---|---|
| 2010/0039354 A1* | 2/2010 | Sakamoto | ............... G02F 1/167 |
| | | | 345/55 |
| 2011/0049508 A1 | 3/2011 | Kawamura et al. | |
| 2013/0196468 A1 | 8/2013 | Yamazaki | |
| 2017/0062541 A1* | 3/2017 | Ishiyama | ............ H01L 27/3272 |

* cited by examiner

| | Transparency (OUT/IN) |
|---|---|
| No N2O Plasma | 89% |
| With N2O Plasma | 78% |

FIG. 16
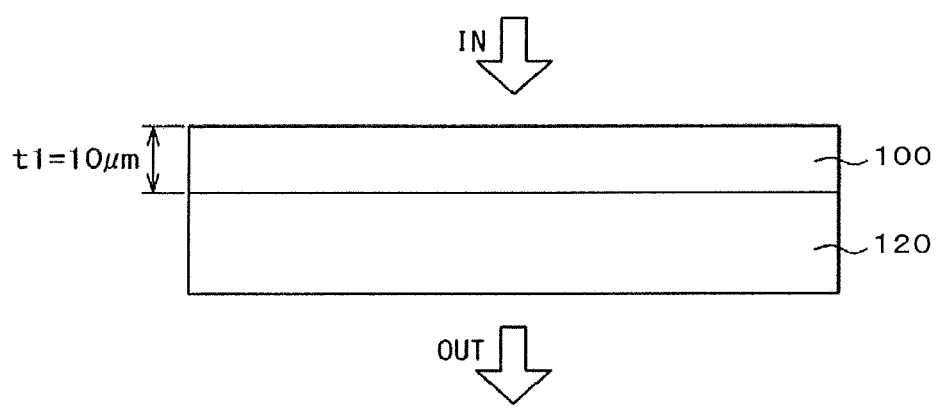
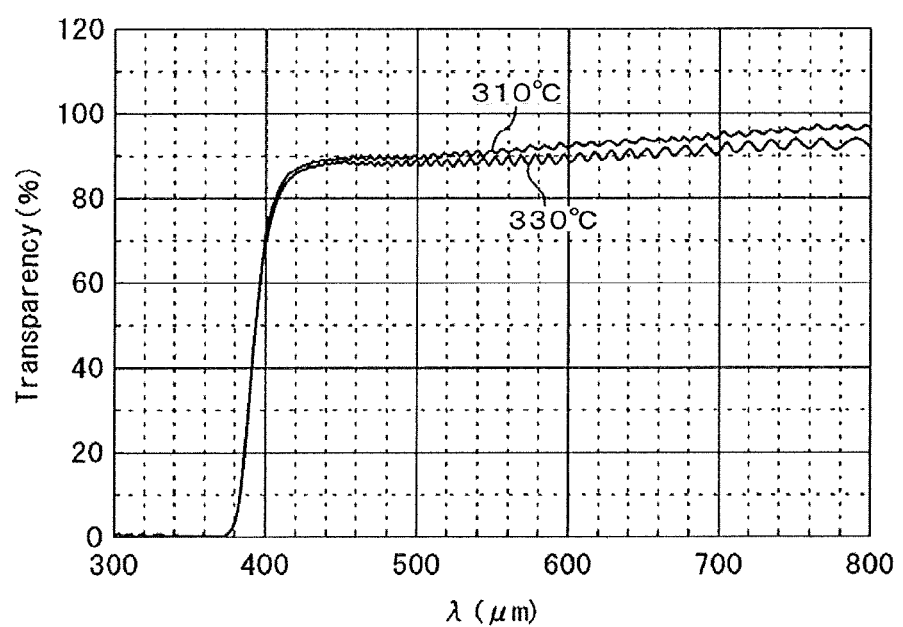

FIG. 17
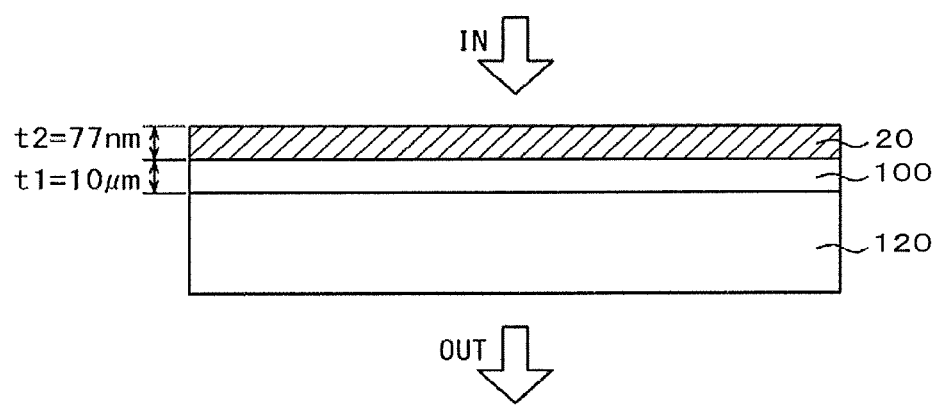
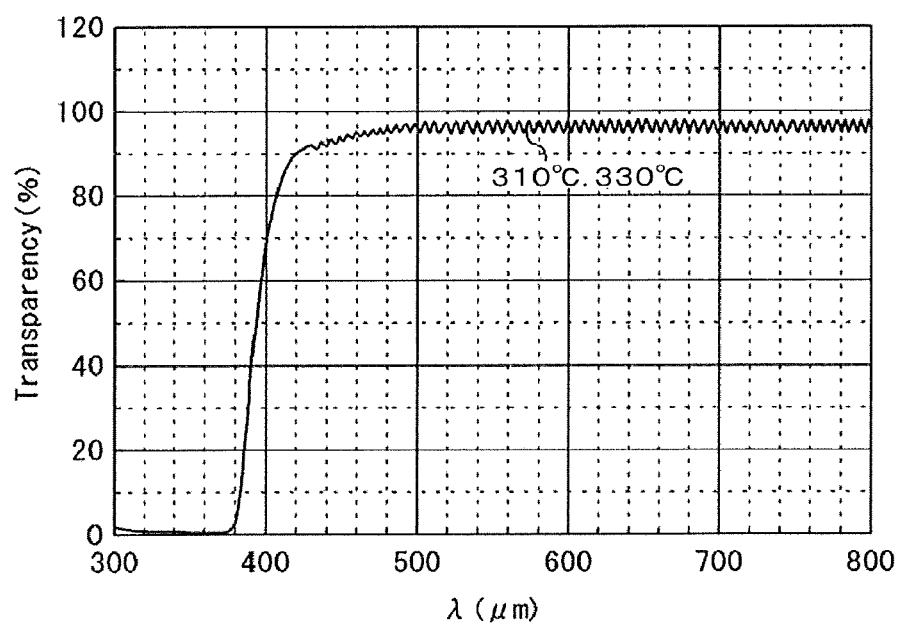

US 10,488,569 B2

DISPLAY DEVICE

CLAIM OF PRIORITY

The present application claims priority from Japanese Patent Application JP 2017-005746 filed on Jan. 17, 2017, the content of which is hereby incorporated by reference into this application.

BACKGROUND OF THE INVENTION (1) Field of the Invention

The present invention relates to the display device having a resin substrate and Thin Film Transistors formed by oxide semiconductors.

(2) Description of the Related Art

The liquid crystal display device has a Thin Film Transistor (herein after TFT) in each of the pixels to control retrieving the data for the pixel. Sometimes, the built in driving circuit is made by TFTs.

The organic EL display device has a first TFT and a second TFT in each of the pixels. The first TFT is a switching TFT that controls retrieving the data to the pixel. The second TFT is a driving TFT that controls the current to the light emitting element. Sometimes, the built in driving circuit is made by TFTs.

Since a leak current in the oxide semiconductor is low, the display device of low power consumption can be realized by using the oxide semiconductors for the TFTs. In addition, a low leak current in the TFTs is profitable for the displays devices driven by low frequency.

Patent document 1 (Japanese patent laid open No. 2013-175718) and Patent document 2 (Japanese patent laid open No. 2011-54812) disclose a TFT having an oxide semiconductor. Patent document 1 discloses a top gate type TFT wherein the metal oxide is formed on the channel, which is formed by the oxide semiconductor, to constitute the gate insulating film. Patent document 1 discloses a bottom gate type TFT, which has an oxide semiconductor, wherein a metal oxide or a semiconductor layer is used as a sacrificing layer in the channel etching process.

SUMMARY OF THE INVENTION

A flexible display device is realized by using a resin like a polyimide for the substrate. In the liquid crystal display device, too, a flexible display device can be realized by using a sheet type back light formed by e.g. the organic EL lighting device.

Among resins, polyimide is best suitable to a substrate because of its mechanical strength and heat resistance, etc. In the liquid crystal display device, which requires a backlight, a polyimide with high transparency is necessary for the substrate. In the present circumstances, however, even a high heat resistant transparent polyimide emits gasses from the transparent polyimide (herein after called simply, polyimide) when it is heated at 300 centigrade or more; decomposition of the material of the polyimide occurs when the polyimide is heated at 350 centigrade or more. If the temperature goes over the glass transition temperature, the material itself gets damages, deceases a transparency, and consequently, a quality of the display is degraded.

A TFT is used for the control of the pixel. If a silicon transistor is used for the TFT, even when the LTPS (Low Temperature Poly-Silicon) is used, the process temperature is higher than 400 centigrade, thus, it is difficult to use the polyimide for the substrate.

On the other hand, if the oxide semiconductor is used for the TFT, the TFT can be formed at approximately 300 centigrade. However, if a life span or a reliability of the display is considered, it is preferable to anneal the oxide semiconductor at 350-400 centigrade in the manufacturing process.

Therefore, it has been difficult to realize a flexible display device of high quality and high reliability when the TFTs of the oxide semiconductors and the substrate formed by polyimide are used because of the heat resistance of the polyimide. Consequently, the purpose of the present invention is to realize a flexible display device having a resin substrate and TFTs formed by oxide semiconductors.

The purpose of the present invention is to solve the above problem; concrete measures are as follows:

(1) A display device comprising: a substrate formed by resin, an inorganic insulating film and a thin film transistor including a semiconductor, an infra-red light reflecting film is formed between the substrate and the thin film transistor, wherein a reflectivity of the infra-red light reflecting film to an infra-red light of a wave length of a 2 μm is 75% or more.

(2) A display device comprising: a substrate formed by resin, a first inorganic insulating film, a second inorganic insulating film and a thin film transistor including a semiconductor, wherein a first infra-red light reflecting film is formed between the substrate and the first inorganic insulating film, a second infra-red light reflecting film is formed on the first inorganic insulating film, the second inorganic insulating film is formed between the second infra-red light reflecting film and the thin film transistor, wherein a reflectivity of the first infra-red light reflecting film to an infra-red light of a wave length of a 2 μm is 75% or more, and a reflectivity of the second infra-red light reflecting film to an infra-red light of a wave length of a 2 μm is 75% or more.

BRIEF DESCRIPTION OF THE DRAWINGS

FIG. 16 is a diagram that shows influence of the temperature to the transmittance;

FIG. 17 is a diagram that shows the effect of the present invention;

DETAILED DESCRIPTION OF THE PREFERRED EMBODIMENTS

The present invention is explained in detail by embodiments.

First Embodiment

Figure 1:
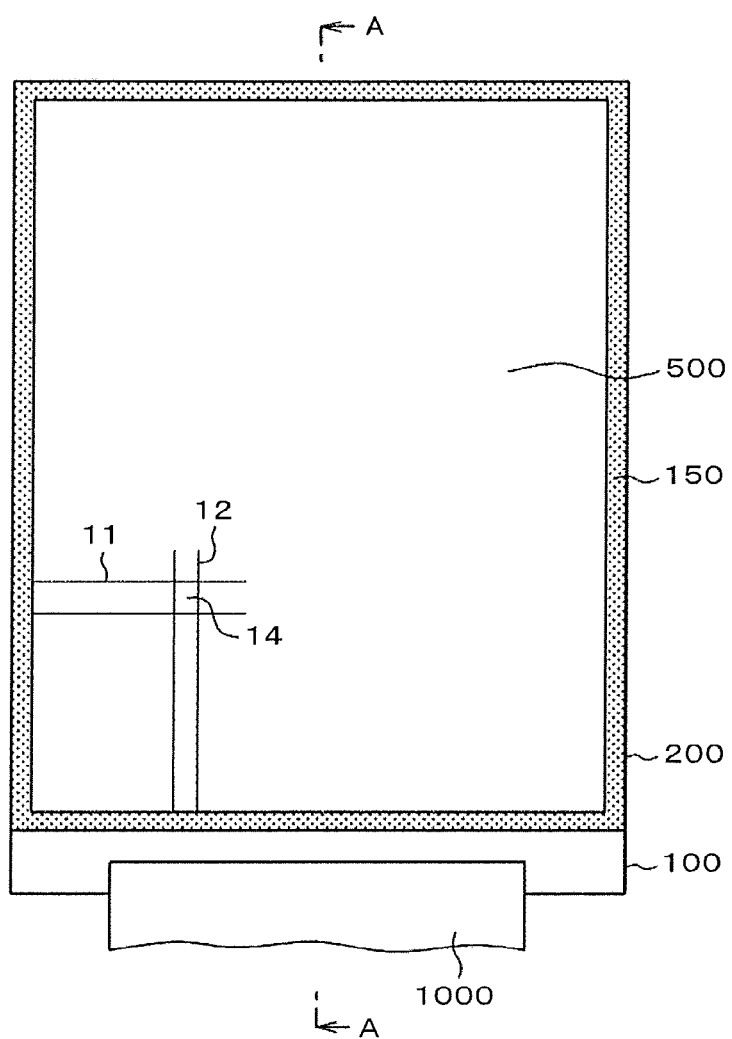
FIG. 1 is a plan view of the liquid crystal display device.

FIG. 1 is a plan view of a liquid crystal display device. In FIG. 1, the TFT substrate 100 and the counter substrate 200 adhere to each other via the seal material 150. The liquid crystal is sealed inwardly from the seal material 150. The display area 500 is formed inside of the seal material 150. In the display area 500 of FIG. 1, scanning lines 11 extend in lateral direction and arranged in longitudinal direction; the video signal lines 12 extend in longitudinal direction and arranged in lateral direction. A pixel 14 is formed in an area surrounded by the scanning lines 11 and the video signal lines 12.

The TFT substrate 100 is made bigger than the counter substrate 200; the portion where the TFT substrate 100 and the counter substrate 200 don't overlap is the terminal area, to which the flexible wiring substrate 1000 connects to supply powers and signals to the liquid crystal display device.

Figure 2:
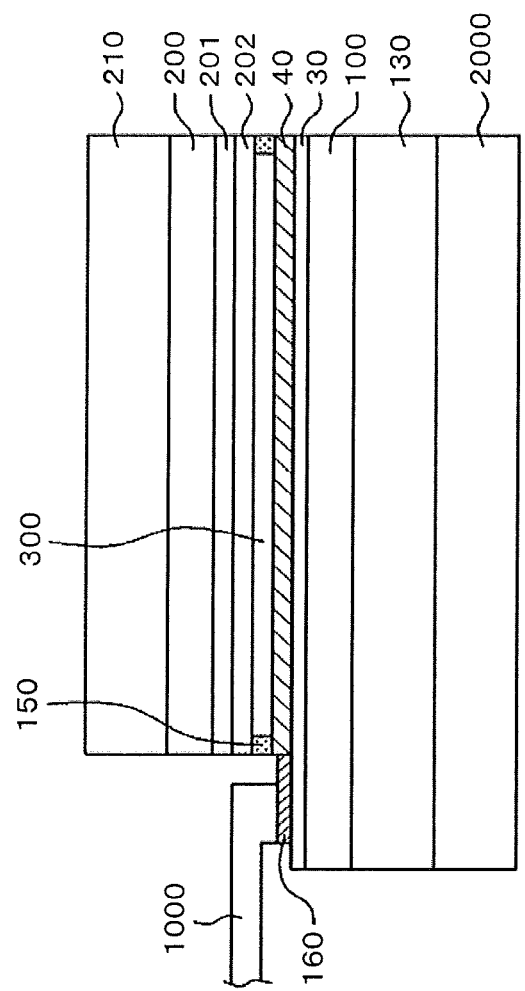
FIG. 2 is cross sectional view along the line A-A of FIG. 1.

FIG. 2 is cross sectional view along the line A-A of FIG. 1. In FIG. 2, the TFT substrate 100 is formed by the polyimide of a thickness of approximately 10 μm. The barrier layer 30 is formed on the TFT substrate 100; the array layer 40 including the TFTs is formed on the barrier layer 30. The barrier layer 30 has a role to block impurities from the polyimide so that they don't contaminate the color filter layer 202 or the liquid crystal layer 300.

In FIG. 2, the counter substrate 200, which opposes to the TFT substrate 100, is also formed by the polyimide. The barrier layer 201 is formed at inner surface of the counter substrate 200; the color filter 202 is formed on the barrier layer 201. The barrier layer 201 has a role to block impurities from the polyimide so that they don't contaminate the color filter layer 202 or the liquid crystal layer 300.

The color filter layer 202 and the array layer 40 adhere to each other by the sealing material 150. The liquid crystal layer 300 is sealed inside of the sealing material 150. The portion where the TFT substrate 100 and the counter substrate 200 don't overlap is the terminal area, to which the flexible wiring substrate 1000 connects.

In FIG. 2, the upper polarizing plate 210 is attached on the counter substrate 200; the lower polarizing plate 130 is attached underneath the TFT substrate 100. Since each of the upper polarizing plate 210 and the lower polarizing plate 130 is a thickness of about 0.1 mm, they have a role of a support plate. The liquid crystal is not self-illuminant, thus, the backlight 2000 is set behind the lower polarizing plate 130. The backlight 2000 is e.g. a sheet type organic EL lighting device or a thin LED backlight, thus, a flexibility of the display is maintained.

Figure 3:
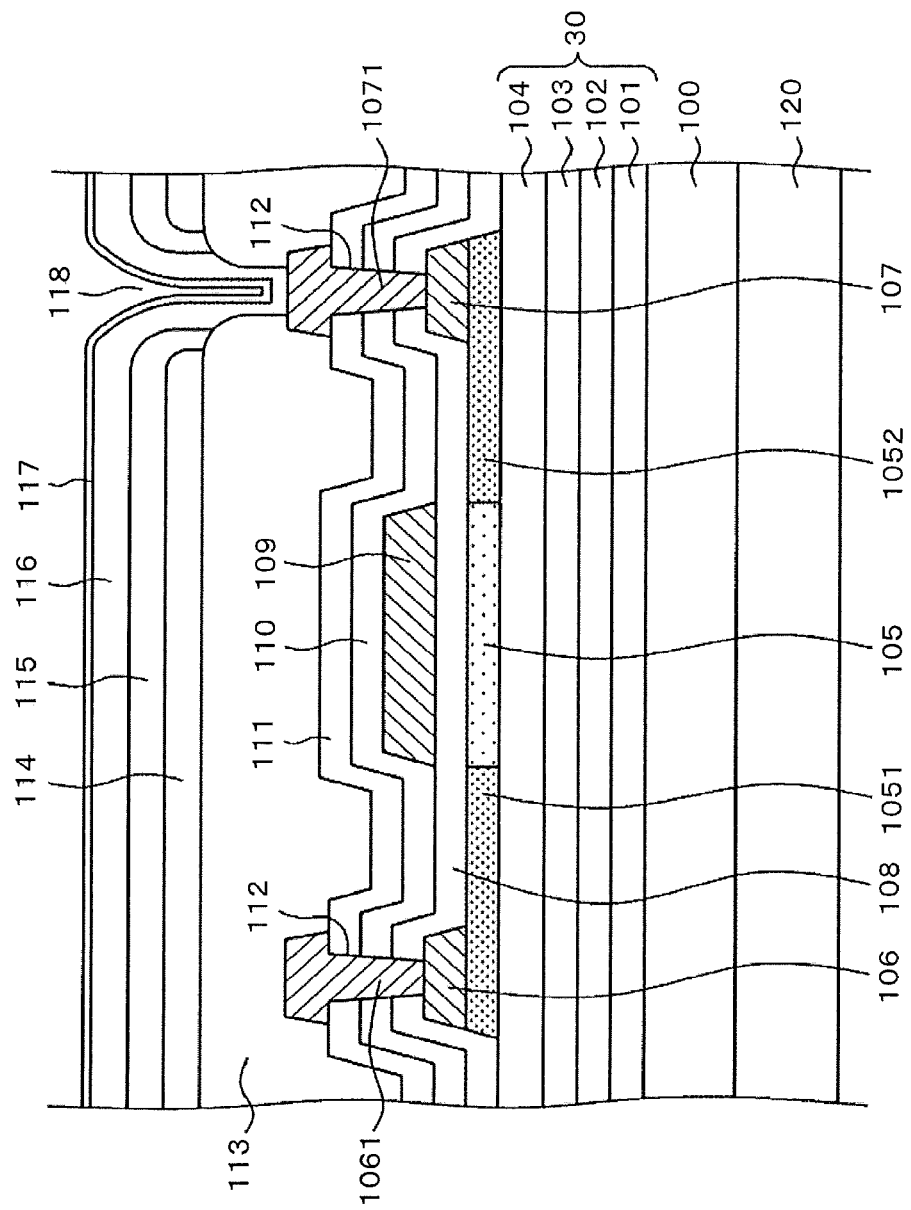
FIG. 3 is a cross sectional view of the TFT substrate.

FIG. 3 is a cross sectional view that the structure on the TFT substrate 100 has been completed in manufacturing process. In FIG. 3, the TFT substrate 100 is formed on the glass substrate 120. In the manufacturing process, a material of the TFT substrate is coated on the glass substrate 120 and baked to form the TFT substrate 100. After the liquid crystal display device is completed, the glass substrate 120 is removed from the TFT substrate 100 by e.g. laser abrasion.

The barrier layer 30, which is constituted by four layers of undercoats, is formed on the TFT substrate 100. The structure of four layers is e.g. as follows: the first undercoat 101 of silicon oxide (herein after SiO), a thickness of 50 nm; the second undercoat of silicon nitride (herein after SiN), a thickness of 50 nm; the third undercoat of SiO, a thickness of 300 nm; the fourth undercoat of SiO, a thickness of 200 nm. The first undercoat through fourth undercoat constitutes a barrier layer 30. The barrier layer 30 may be simply called as the undercoat 30 in this specification. The barrier layer 30 prevents the semiconductor layer 103 from being contaminated by impurities from the polyimide substrate 100. In addition to a role to block the impurities from the polyimide substrate 100, the fourth under coat 104 has another role that supplies oxygen to the oxide semiconductor layer 105 to make the characteristics of the semiconductor stable. For that purpose, the fourth undercoat 104 is formed by different manufacturing condition from the third undercoat 103.

The oxide semiconductor 105 is formed on the undercoat 104. The oxide semiconductor 105 is e.g. IGZO (Indium Gallium Zinc Oxide). Other examples of the oxide semiconductor are ITZO (Indium Tin Zinc Oxide), ZnON (Zinc Oxide Nitride), IGO (Indium Gallium Oxide), and so on.

The drain electrode 106 is formed on the drain area 1051 of the oxide semiconductor 105 and the source electrode 107 is formed on the source area 1052 of the oxide semiconductor 105. Both of the drain electrode 106 and the source electrode 107 are formed by Ti at a thickness of 150 nm. Since the Ti deprives the oxide semiconductor of oxygen, the area of the oxide semiconductor, where Ti contacts, becomes conductive.

The gate insulating film 108 is formed covering the oxide semiconductor 105, the drain electrode 106 and the source electrode 107. The gate electrode 109 is formed on the gate insulating film 108. The gate electrode 109 is e.g. a laminated film of Al alloy of a thickness of 300 nm as a lower layer and Ti of a thickness of 50 nm as an upper layer.

After that the Ion implantation is applied to dope impurities of e.g. Phosphor (P) or Boron (B) to the oxide semiconductor 105 using the gate electrode 109 as a mask to give conductivity to the oxide semiconductor 105 except the area underneath the gate electrode 109; thus, the drain area 1051 and the source area 1052 are formed. After that, the gate electrode 109 and the gate insulating film 108 are covered by the first interlayer insulating film 110 formed by SiO at a thickness of 200 nm, and further covered by the second interlayer insulating film 111 formed by SiN at a thickness of 200 nm After that, through holes 112 are formed through the second interlayer insulating film 111, the first interlayer insulating film 110 and the gate insulating film 108; the drain electrode 1061 and the source electrode 1071 are formed in the through holes 112. The drain electrode 1061 connects with the video signal line, and the source electrode 1071 connects with the pixel electrode.

The organic passivation film 113 of e.g. acrylic resin is formed covering the second interlayer insulating film 111. Since the organic passivation film 113 works also as a flattening film, it is made thick at a thickness of approximately 2-4 μm. The common electrode 114 is formed in a solid plane shape by ITO (Indium Tin Oxide) at a thickness of approximately 77 nm on the organic passivation film 113. After that, the capacitive insulating film 115 is formed by SiN at a thickness of 70 nm, then, the pixel electrode 116 is formed on the capacitive insulating film 115. The pixel electrode 116 is comb shaped or single stripe shaped.

The pixel electrode 116 connects with the source electrode 1071 through a through hole in the capacitive insulating film 115 formed in the through hole 118 formed in the organic passivation film 113. Then the alignment film 117 is formed on the pixel electrode 116. The alignment film 117 determines the initial alignment direction of the liquid crystal molecules. The alignment process of the alignment film 117 is made by rubbing method or by photo alignment method using ultra violet ray.

The structure on the TFT substrate is completed by the above process. On the other hand, the color filters 202 et al. are formed on the counter substrate 200; the TFT substrate and the counter substrate 200 are adhered to each other through the sealing material 150 as depicted in FIGS. 1 and 2. Generally, the sealing material 150 is applied to the counter substrate 200 and the liquid crystal is dropped on the counter substrate 200; then the TFT substrate 100 and the counter substrate 200 are adhered to each other to seal the liquid crystal inwardly form the sealing material.

Figure 4:
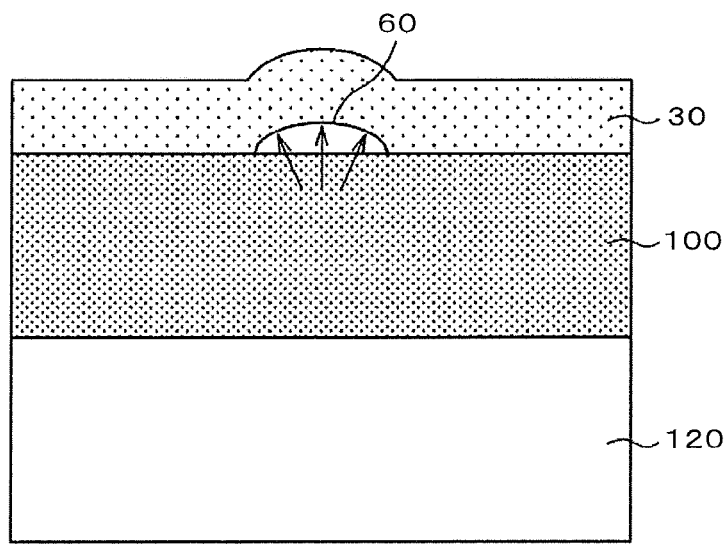
FIG. 4 is an example of a void formed between the substrate and the undercoat.

In FIG. 3, the oxide semiconductor is used for the semiconductor layer 105. Although the oxide semiconductor 105 can be formed by a process temperature of approximately 300 centigrade, annealing of higher temperature is preferable for higher reliability. However, the TFT substrate, if it is formed by resin like the polyimide, it emits gasses like moisture, hydrogen, carbon monoxide, carbon dioxide, et al, when temperature goes up to approximately 310 centigrade or more. In that case, as depicted in FIG. 4, a void 60 is formed between the polyimide substrate 100 and the undercoat 30; consequently, adherence between the polyimide substrate 100 and the undercoat 30 is decreased. Another disadvantage is a decrease in transmittance of light due to the voids 60, thus, the quality of the display decreases.

FIG. 3 shows that the TFT substrate 100 is formed on the glass substrate 120 at a thickness of approximately 10 μm; the undercoat 30 of a laminated film of four layers is formed on the TFT substrate 100. In this state, if the TFT substrate 100 is heated at as high as 310 centigrade, gasses are emitted from the polyimide, consequently, voids 60 are formed.

Figure 5:
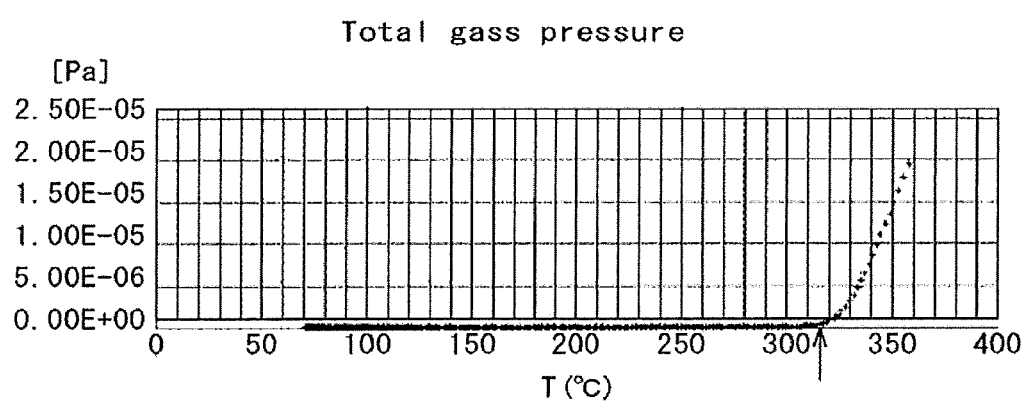
FIG. 5 is a diagram that shows amount of total gas emitted from the polyimide with respect to temperature.
Figure 6:
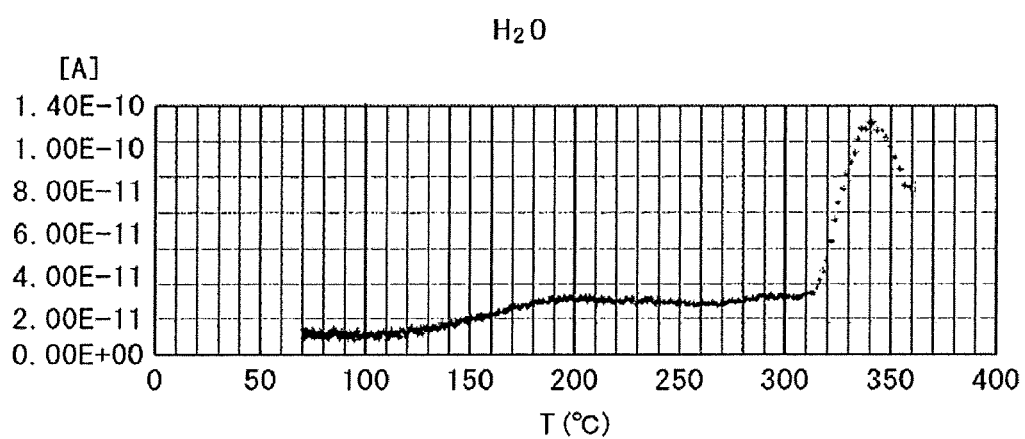
FIG. 6 is a diagram that shows amount of moisture emitted from the polyimide with respect to temperature.

FIGS. 5-9 are the results of the gas analyses for the gasses generated by the polyimide. The gas analysis is performed by TDS (Thermal Desorption Spectrometry). In FIG. 5, the abscissa is a temperature (centigrade) of the polyimide and the ordinate is a total gas emission (Pa) from the polyimide. The TDS method identifies a kind of gas and measures the amount of gas using a quadrupole mass analyzer. Therefore, the amount of existence of gasses is detected by current. The ordinate of FIGS. 6-9 is current; the current can be interpreted as the amounts of gasses. As described in FIG. 5, the gas from the polyimide increases sharply when the temperature goes up higher than 310 centigrade. In FIG. 6, the abscissa is temperature (centigrade) of the polyimide; and the ordinate is amount of moisture ($H_2O$) emitted from the polyimide, the unit is A (Ampere). As depicted in FIG. 6, the amount of moisture increases sharply when the temperature becomes over 310 centigrade.

Figure 7:
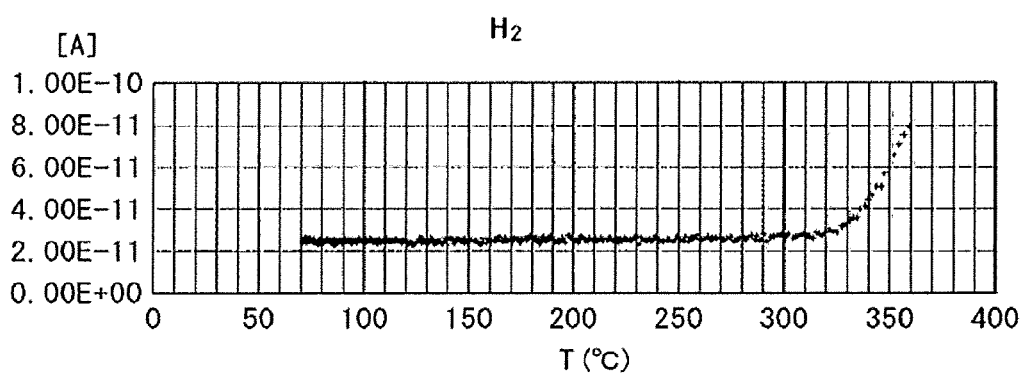
FIG. 7 is a diagram that shows amount of hydrogen emitted from the polyimide with respect to temperature.
Figure 8:
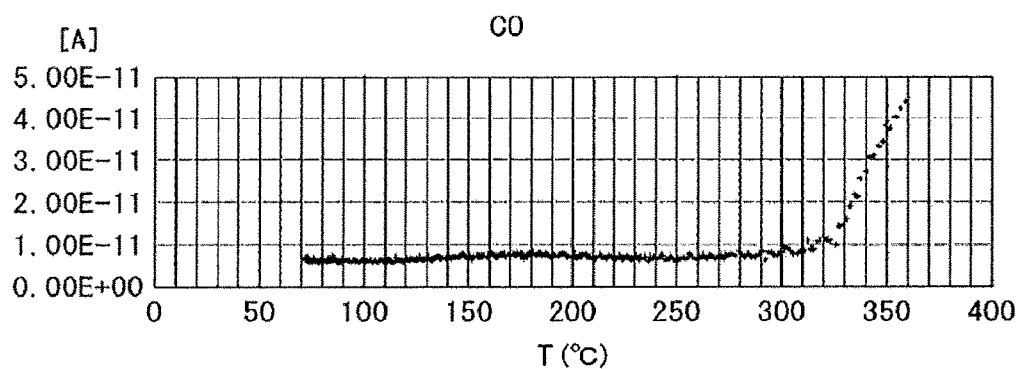
FIG. 8 is a diagram that shows amount of carbon mono-oxide emitted from the polyimide with respect to temperature.
Figure 9:
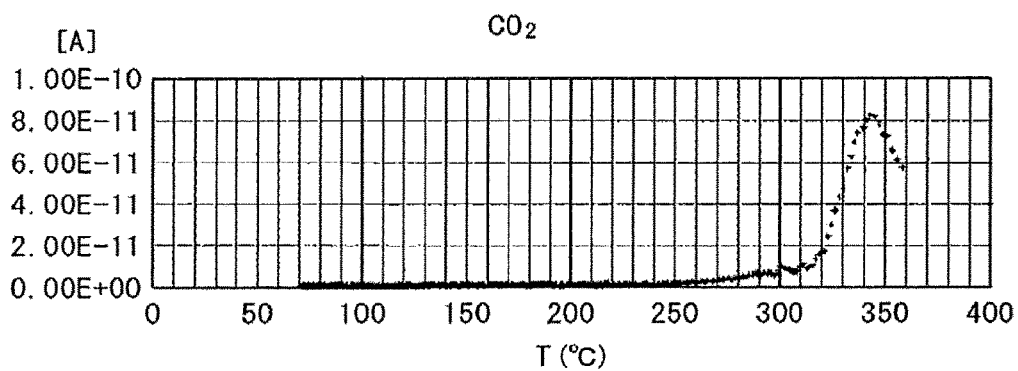
FIG. 9 is a diagram that shows amount of carbon di-oxide emitted from the polyimide with respect to temperature.

FIG. 7 is a result that the same evaluation as FIG. 6 is made to hydrogen. The amount of emission of hydrogen increases sharply when the temperature becomes over 310 centigrade. FIG. 8 is a result that the same evaluation as FIG. 6 is made to carbon mono oxide. The amount of emission of carbon mono oxide increases sharply when the temperature becomes over 310 centigrade. FIG. 9 is a result that the same evaluation as FIG. 6 is made to carbon dioxide. The amount of emission of carbon dioxide increases sharply when the temperature becomes over 310 centigrade.

As described above, when the gas is emitted from the polyimide, a void 60 as shown FIG. 4 is generated. If the adhering strength between the polyimide substrate 100 and the undercoat 30 is large, there is a chance that the generation of voids is suppressed. For example, when N2O plasma is applied to the surface of the polyimide substrate 100 before the undercoat 30 is formed, the surface of the polyimide substrate becomes rough; consequently, generation of voids 60 between the polyimide substrate 100 and the undercoat 30 is suppressed.

Figure 10:
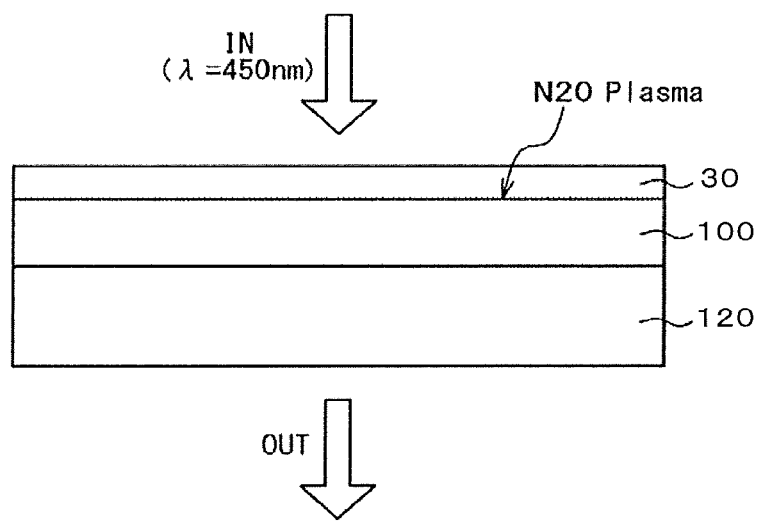
FIG. 10 is a model to show the change of the transmittance when N2O plasma is applied.

However, such method, roughing the surface of the polyimide substrate, decreases the transmittance of the polyimide. FIG. 10 is a cross sectional view to evaluate the transmission of the substrate 100. In FIG. 10, the polyimide as the TFT substrate 100 is formed on the glass substrate 120; the undercoat 30 is formed on the TFT substrate 100. In one sample, a specific process is not applied between the TFT substrate 100 and the undercoat 30. In another sample, N2O plasma is applied on the polyimide substrate 100 before the undercoat 30 is formed to increase an adhering strength between the polyimide substrate 100 and the undercoat 30.

FIG. 10 is an example that the transmittance of light is examined in the two samples. The wavelength γ of the measuring light is 450 nm. In the table of FIG. 10, the transmittance of the sample that experienced the N2O plasma is 78%, which is much lower compared with the transmittance of 89% of the sample that has not experienced the N2O plasma. The liquid crystal displays uses a back light, thus, the decrease in transmittance of the TFT substrate 100 results in the decrease of brightness of the screen; which construes more power consumption in the liquid crystal display device for the same brightness of the screen.

The present invention enables to anneal the oxide semiconductor by high temperature without raising the temperature of the polyimide more than 310 centigrade; thus, realizes the liquid crystal display device having high quality of display images and high reliability, simultaneously.

Figure 11:
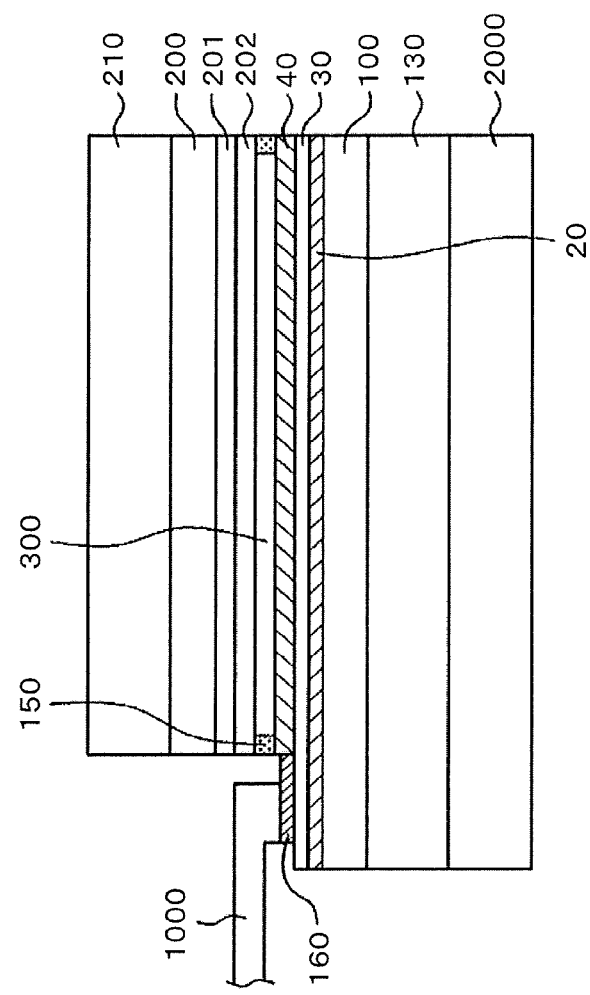
FIG. 11 is a cross sectional view of the liquid crystal display device according to the present invention.

FIG. 11 is a cross sectional view of the liquid crystal display device of the present invention. The liquid crystal display device of FIG. 11 differs from the structure of FIG. 2 in that FIG. 11 has an infra-red light reflection film 20 formed between the TFT substrate 100 and the undercoat 30. The infra-red light reflection film 20 is formed e.g. by the ITO at a thickness of 77 nm. While the infra-red light reflection film 20 is formed on all over the TFT substrate 100 in FIG. 11, the infra-red light reflection film 20 needs to cover at least the display area 500.

In FIG. 11, the oxide semiconductor 105 is formed in the array layer 40. The oxide semiconductor 105 is heated and annealed by irradiating the infra-red light from the screen surface side. It is preferable to anneal the oxide semiconductor 105 at 310 centigrade or more. However, the gas emission increases sharply from the polyimide at 310 centigrade or more.

To countermeasure this problem the infra-red light reflection film 20 is formed between the polyimide substrate 100 and the undercoat 30. Since the infra-red light reflection film 20 reflects the infra-red light, the temperature rise of the polyimide isn't so much. On the other hand, the reflected infra-red light heats the oxide semiconductor 105 again, thus, the temperature of the oxide semiconductor 105 becomes higher. By this principle, the temperature of the polyimide is maintained at the temperature that the gasses don't go out, and, at the same time, the oxide semiconductor can be annealed at high temperature.

Figure 12:
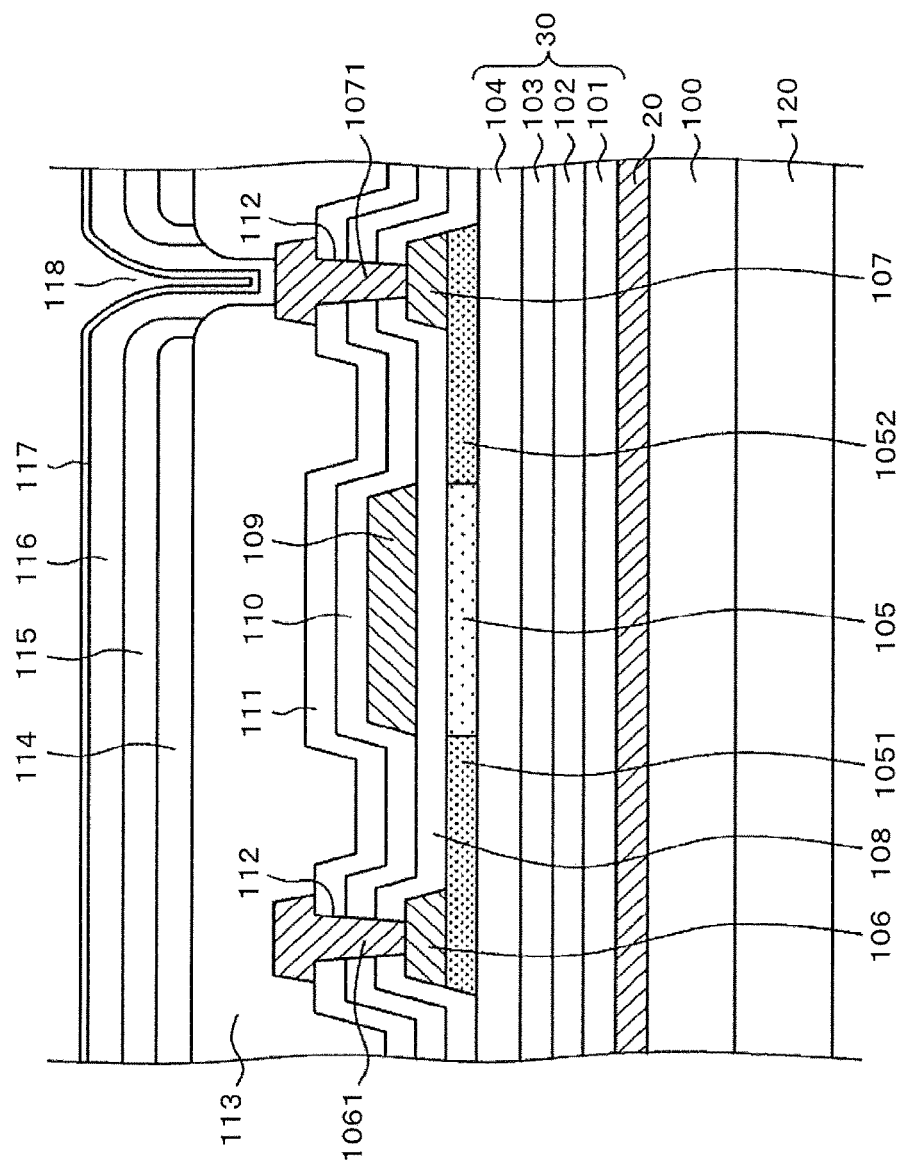
FIG. 12 is a cross sectional view of the TFT substrate according to the present invention.

FIG. 12 is a cross sectional view of the TFT substrate of the present invention. FIG. 12 differs from FIG. 3 in that the ITO 20 as an infra-red light reflection film is formed between the TFT substrate 100 and the undercoat 30. The thickness of the ITO 20 is e.g. 100 nm. The glass is omitted in FIG. 12; other structure of FIG. 12 is the same as the structure of FIG. 3.

Figure 13:
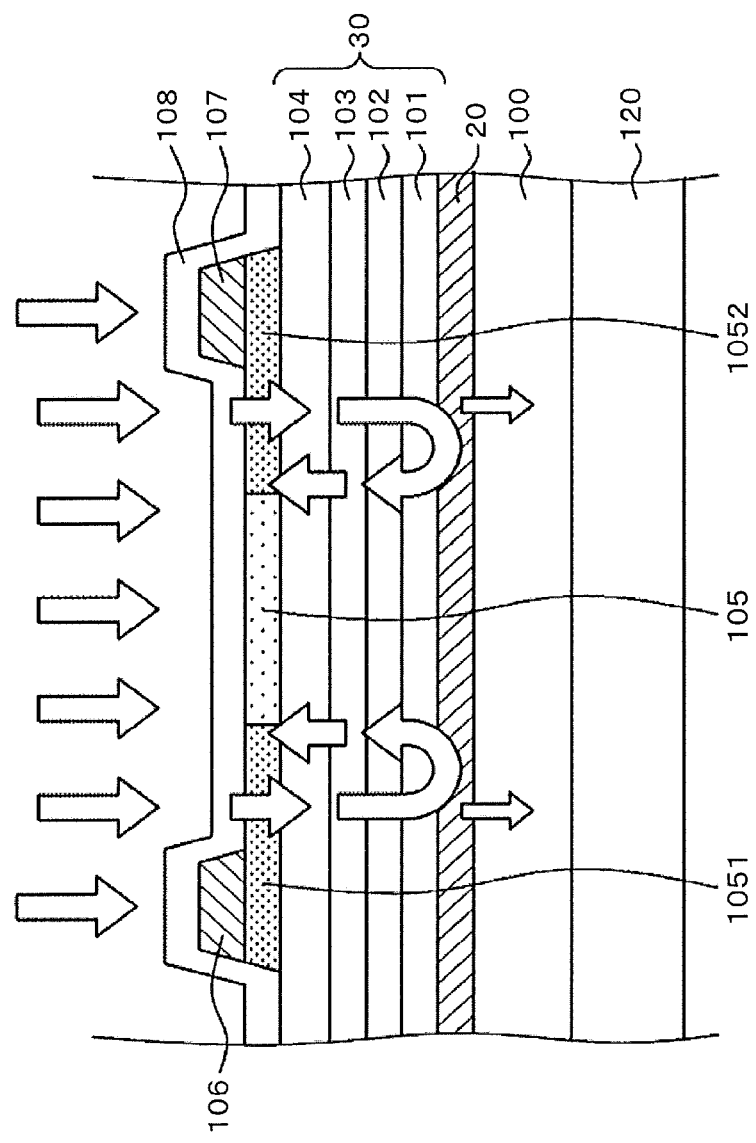
FIG. 13 is a cross sectional view that shows the function of the first embodiment.

FIG. 13 is the drawing to show the function of the infra-red light reflection film 20. FIG. 13 shows that the gate insulating film 108 is formed to cover the oxide semiconductor 105. In this state, infra-red light is irradiated from the side of the gate insulating film as shown by the arrows in FIG. 13. To fully anneal the oxide semiconductor 105, it is preferable to anneal the oxide semiconductor at 310 centigrade or more, and preferably at 350-400 centigrade. FIG. 13 shows that the infra-red light is irradiated to anneal the oxide semiconductor film at a temperature of approximately 360 degree.

In FIG. 13, the infra-red light heats the oxide semiconductor 105, at the same time a part of it penetrates into the lower layers. The infra-red light, which penetrated the oxide semiconductor 105, reflects at the infra-red light reflection film 20. Therefore, only a part of the infra-red light reaches to the polyimide substrate 100; thus, the polyimide is not heated so much as the layer above the infra-red light reflection film 20.

On the other hand, the infra-red light, reflected from the infra-red light refection film 20, again heats the oxide semiconductor 105, thus, the oxide semiconductor 105 is heated effectively. Therefore, the temperature of the polyimide substrate 100 is kept lower than 310 centigrade while the semiconductor 105 is heated at 360 centigrade.

Figure 14:
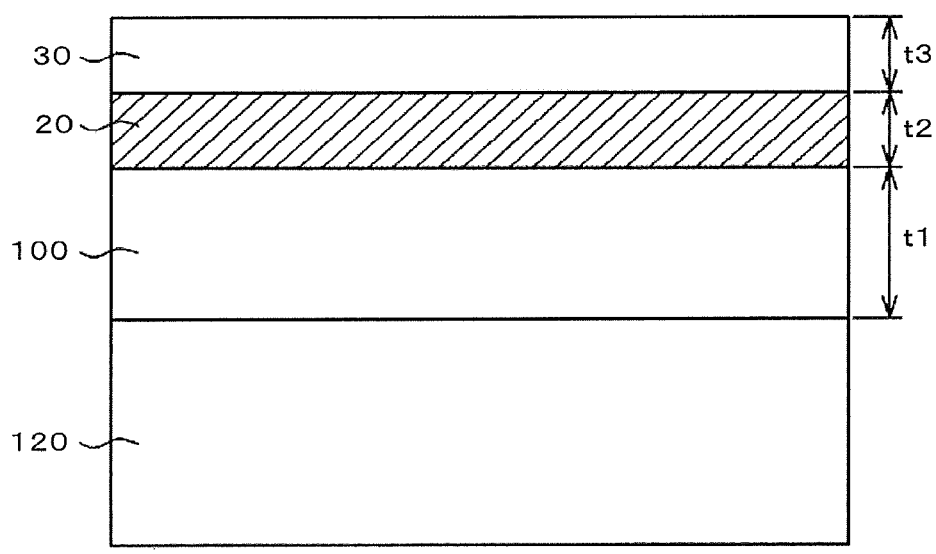
FIG. 14 is a cross sectional view at the vicinity of the infra-red light reflection film.

FIG. 14 is a cross sectional view of an interim structure of FIG. 13 as that: the polyimide substrate 100 is formed on the glass substrate 120; the ITO 20, which works as an infra-red light reflection film, is formed on the TFT substrate 100; the undercoat 30 formed by e.g. a laminated film of SiO layer, SiN layer and SiO layer is formed on the infra-red light reflection film 20 (ITO). In FIG. 14, the thickness t1 of the polyimide 100 is 10 μm, the thickness t2 of the ITO 20 is 100 nm, the thickness t3 of the undercoat 30 is 400 nm (SiO/SiN/SiO=50 nm/50 nm/300 nm).

The ITO for the infra-red light reflection film 20 on the polyimide substrate 100 can be formed by the CVD (Chemical Vapor Deposition), the vacuum deposition, the spraying, or the sputtering; among them, the sputtering is the most favorable. The energy of particles by sputtering is high, thus, adherence with the polyimide can be stronger. In addition, the density of the layer formed by sputtering can be bigger than that formed by e.g. the CVD. Therefore, the infra-red light reflecting layer 20 formed by sputtering can be used as a barrier film, too.

Since the surface of the poly crystalline film of ITO is uneven, a strong adherence can be maintained even the undercoat 30 is formed directly on the ITO film. On the contrary, if there is a possibility that some surface contamination occur after the ITO 20 is formed, a cleaning of the surface of the ITO 20 is possible by applying N2O plasma. Even N2O plasma applied, an ashing reaction doesn't occur at the surface of the ITO 20, the rough surface that scatters the light is not formed; consequently, the transmittance of light doesn't decrease.

The thickness of the ITO of the infra-red light reflection film 20 is important. The ITO must have certain thickness to work as the infra-red light reflection film 20. From this point, a thickness is 50 nm or more. On the other hand, since the infra-red light reflection film 20 is formed on all over the polyimide substrate 100 or at least on the display area 500, a high transmittance for the visible light must be maintained. From this point, a thickness of the infra-red light reflection film is 200 nm or less.

Considering the characteristics of the infra-red light reflection film 20, it is preferable that the reflectivity for the visible light (e.g. of wave length is 450 nm) is 25% or less, and the reflectivity for the infra-red light is 75% or more. On the contrary, as to the transmittance, high transmittance (70% or more) is preferable for the visible light at e.g. the wave length of 450 nm; low transmittance (10% or less) for the infra-red light at e.g. the wave length of 2 μm.

Figure 15:
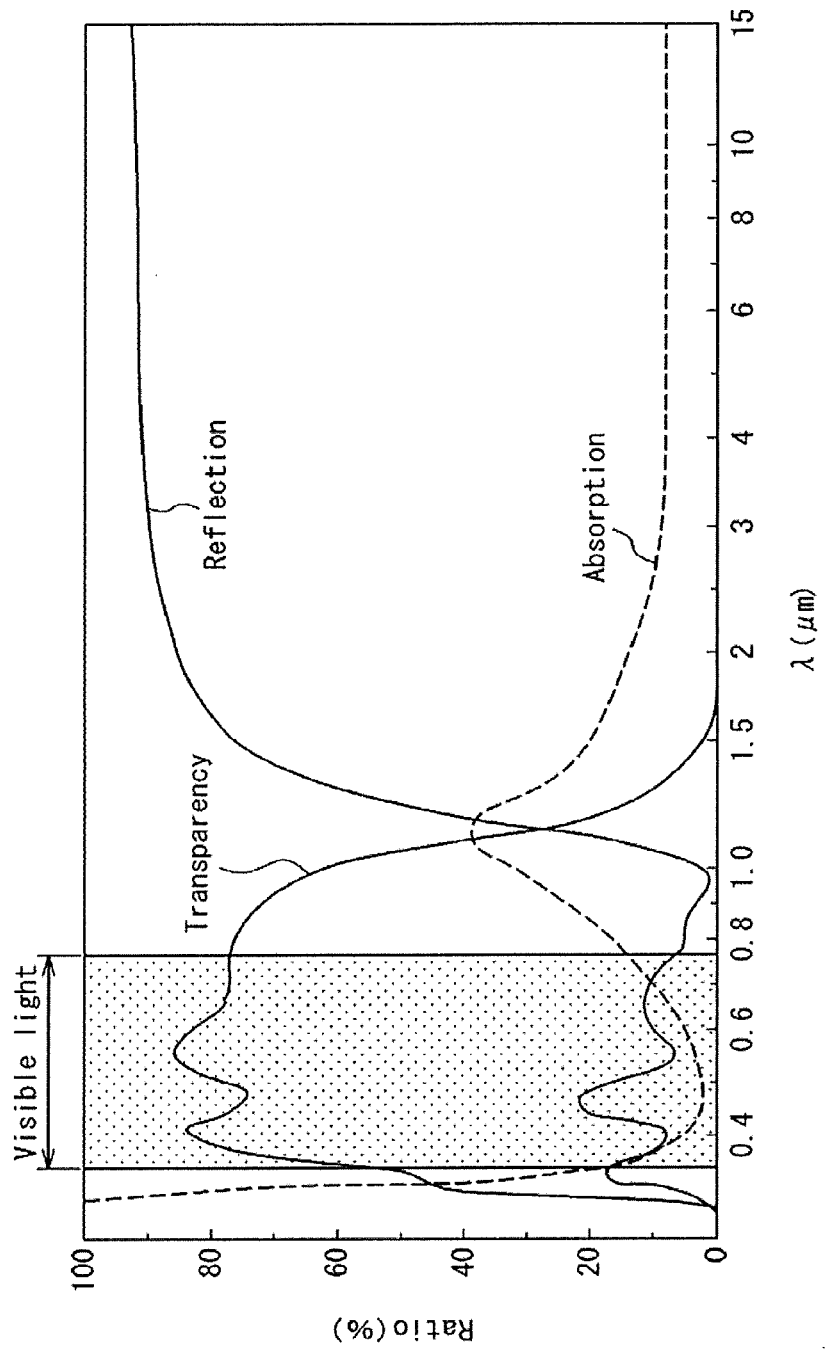
FIG. 15 is spectra of the reflectivity, the transmittance and the absorbance of the ITO.

FIG. 15 is a graph that shows the characteristics of the ITO used as the infra-red light reflection film 20. In FIG. 15, the abscissa is wave length (μm) in log scale. The ordinate is reflectivity (%), transmittance (%) and absorbance (%). FIG. 15 is the case that the thickness of the ITO is 77 nm. As shown in FIG. 15, as to the reflectivity of the ITO, while the reflectivity is as low as 25% or less in all the range of the visible light, the reflectivity for the infra-red light is high; for example, the reflectivity for the infra-red light at a wave length of 1.5 μm is 75% or more, and at a wave length of 2 μm is 85% or more. Thus, the ITO is suitable for the reflecting film. On the other hand, as to the transmittance of the ITO, while the transmittance is as high as 70% or more for the visible light of a wave length of 450 nm, the transmittance is 5% or less for the infra-red light of a wave length of 1.5 μm almost zero for the infra-red light of a wave length of 2 μm. Therefore, if the infra-red light is used for the annealing, wave length is preferably 1.5 μm or longer, and more preferably 2 μm or longer.

FIGS. 16 and 17 show the effects of the present invention. FIG. 16 shows a change of the transmittance of the polyimide substrate 100 when it is baked in the furnace at 310 centigrade and at 330 centigrade. The transmittance is detected in every wavelength. As shown in FIG. 16, the transmittance is decreased in the case the sample is baked at 330 centigrade than in the case the sample is baked at 310 centigrade. Namely, the damage in the polyimide is bigger when it is baked at 330 centigrade than when it is baked at 310 centigrade; thus, scattering of light is bigger in the case when it is baked at 330 centigrade, consequently, the transmittance decreases.

FIG. 17 is an example when the polyimide substrate 100 that is covered by the ITO 20 of a thickness of 77 nm is heated by infra-red light. The ITO 20 is formed by reactive sputtering. In FIG. 17, the infra-red light is irradiated in the direction of the arrow. The diagram in FIG. 17 shows the transmittance detected at every wave length. The temperature in the diagram in FIG. 17 corresponds to the power of the infra-red light when the polyimide substrate 100 is heated to the temperature of 310 centigrade and 330 centigrade in the case that the ITO doesn't exist. Namely, the actual temperature of the polyimide substrate 100 in FIG. 17 does not go up as high as 310 centigrade or 330 centigrade when the ITO as the infra-red reflecting layer 20 exists.

FIG. 17 shows the transmittance doesn't change between at temperatures of 310 centigrade and 330 centigrade. It means that even the power that raises the polyimide substrate to 330 centigrade is applied, the actual temperature of the polyimide substrate 100 in FIG. 17 doesn't rise up so high when the infra-red light reflection film 20 exists; thus deterioration of the polyimide doesn't occur.

FIG. 17 further shows the transmittance in both of at temperatures of 310 centigrade and 330 centigrade is higher than the transmittance at temperatures of 310 centigrade and 330 centigrade in FIG. 16. It can be understood as that: in FIG. 16, even at the temperature of 310 centigrade, some deterioration in the polyimide occurs and this affects the transmittance of the polyimide substrate 100. However, in FIG. 17, thanks to the infra-red light reflection film 20, actual temperature of the polyimide substrate 100 doesn't rise up so high even the power corresponding to 310 centigrade or 330 centigrade is applied, thus, deterioration of the polyimide doesn't occur, consequently, high transmittance is maintained. Namely, the infra-red light reflection film 20 is very effective.

As described above, a deterioration of the polyimide substrate 100 can be avoided by forming the infra-red light reflection film 20 between the oxide semiconductor film 105 and the polyimide substrate 100; thus, a device of high quality image display with high reliability can be realized.

Second Embodiment

Figure 18:
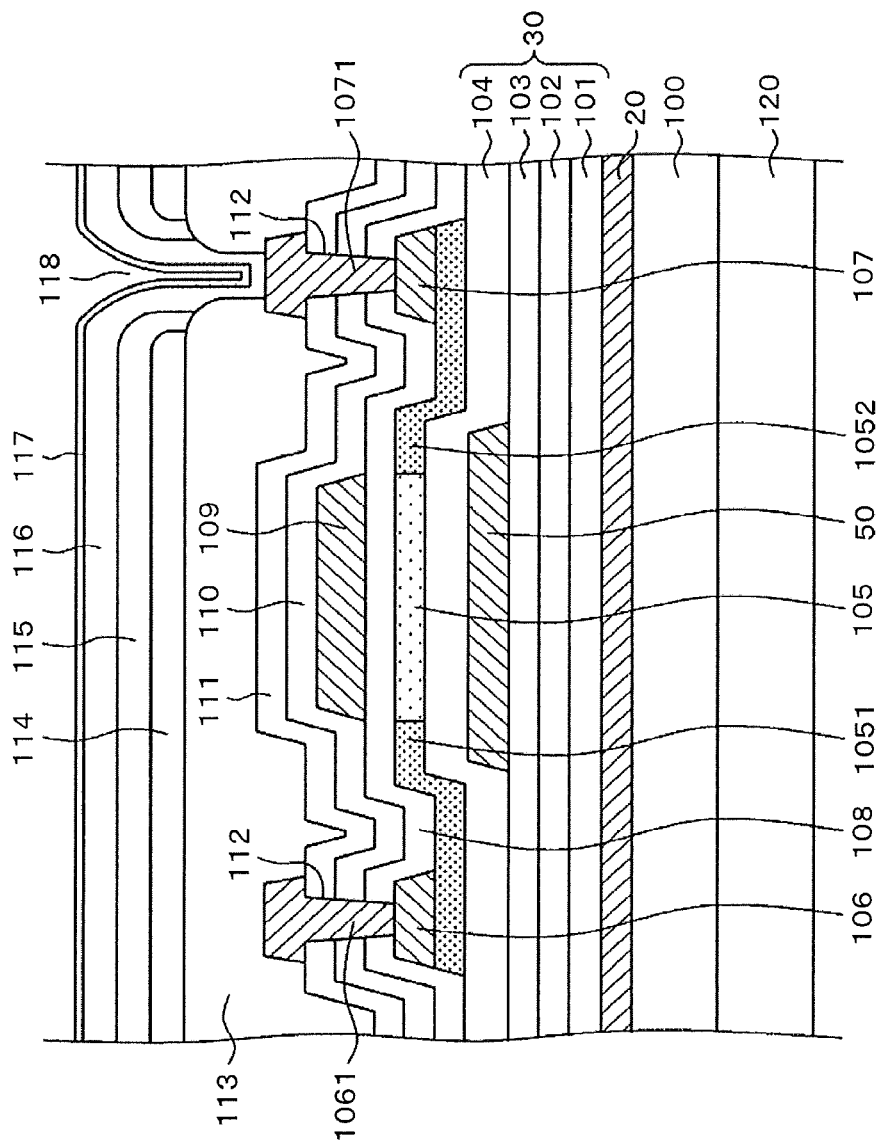
FIG. 18 is a cross sectional view of the TFT substrate according to the second embodiment.

FIG. 18 is a cross sectional view of the structure of the TFT substrate according to the second embodiment. FIG. 18 differs from FIG. 12 of the first embodiment in that the second infra-red light reflection film 50 is formed between the third undercoat 103 and the fourth undercoat 104. The second infra-red light reflection film 50 overlaps at least with the oxide semiconductor 105 in a plan view. However, the second infra-red light reflection film 50 doesn't need to cover all the display area in FIG. 18. The second infra-red light reflection film 50 can be a metal as far as the absorbance in the infra-red light area is low. In this embodiment, an Al film of a thickness of 200 nm is used for the second infra-red light reflection film 50, which has an absorbance of 0.1 or less to the infra-red light of wave length of 2 μm, however, the thickness of the Al film can be changed in a range between 50 nm and 400 nm. If the thickness is less than 50 nm, the reflectivity decreases while if the thickness is too big, the process burden increases.

On the other hand, since the second infra-red light reflection film 50 is set nearer to the oxide semiconductor 105, using a material of high absorbance of infra-red light (e.g. absorbance of infra-red light is 0.4 or more to the wave length of 2 μm), the second infra-red light reflection film 50 is heated, thus, the second infra-red light reflection film 50 can be a nearly located heat source for the anneal of the oxide semiconductor 105.

The thicknesses of the first undercoat 101 and the second undercoat 102 are the same as the ones in the first embodiment. However, the thickness of the third undercoat 103, which is e.g. 500 nm, is thicker in FIG. 18 than that in FIG. 12. In FIG. 18, the second infra-red light reflection film 50 is formed on the third undercoat 103; the fourth undercoat 104 covers the second infra-red light reflection film 50. The fourth undercoat 104 is formed as thick as 300 nm by SiO, which is thicker than the fourth undercoat 104 in FIG. 12, to fully insulate the oxide semiconductor 105, which is formed on the fourth undercoat 104, from the second infra-red light reflection film 50. Another reason to make the fourth undercoat 104 thick is for a good step coverage at the edge of the second infra-red light reflection film 50.

In the liquid crystal display device, the region where the TFT is formed is covered and light shielded by the black matrix formed on the counter substrate, therefore, the transmittance is not affected by the second infra-red light reflection film 50 as far as it is formed only underneath of the oxide semiconductor film 105 as depicted in FIG. 18. By the way, other metals than Al can be used as far as it has a high reflectivity against the infra-red light; for example they can be Mo, W, Cr, Ti or alloys of those metals (e.g. Al—Si system). Further, a laminated film of those materials is also applicable, for example, Al of a thickness of 150 nm as a base layer and Ti of a thickness of 50 nm as an upper layer.

Figure 19:
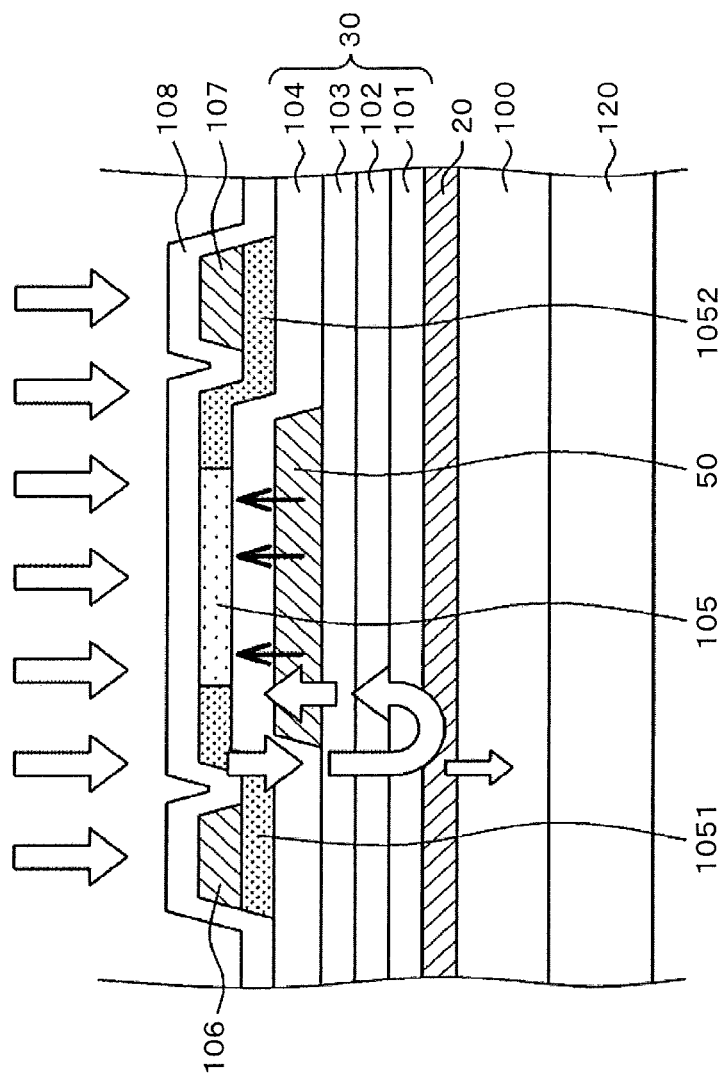
FIG. 19 is a cross sectional view to show the effects of the second embodiment.

FIG. 19 is a cross sectional view that shows the effect of the second infra-red light reflection film 50. In FIG. 19, the oxide semiconductor 105 is being annealed by infra-red light. As described in the first embodiment, the infra-red light reflection film 20 (herein after it may be called as the first infra-red light reflection film), which is formed between the polyimide substrate 100 and the first undercoat 101, reflects the infra-red light. In addition to this, in FIG. 19, the second infra-red light reflection film 50 made by Al is formed under the oxide semiconductor 105 to reflect the infra-red light that penetrated through the oxide semiconductor 105, and consequently, to heat the oxide semiconductor 105 from back again as depicted by black arrows in FIG. 19. Therefore, the oxide semiconductor 105 is heated effectively from both sides of front and back; consequently, a thorough anneal of the oxide semiconductor 105 is possible. On the other hand, efficient heating of the oxide semiconductor 105 enables to decrease the power for the anneal; thus, the damage to the TFT substrate 100 by heat is mitigated.

Forming the second infra-red light reflection film 50 under the TFT of oxide semiconductor 105 has another merit as follows. In the liquid crystal display device, the display panel is exposed with light from the back light; however, the characteristics of the oxide semiconductor 105 are degraded if it is exposed to the light for a long time. If the second infra-red light reflection film 50 is formed by metal, the metal blocks the light from the back light, thus, degradation of the semiconductor 105 can be avoided.

On the other hand, the ITO can be used for the second infra-red light reflection film 50 as in the case of the first embodiment. As described in FIG. 15, the ITO has a high reflectivity against the infra-red, thus, the oxide semiconductor 105 can be effectively heated. In this case, the thickness of the ITO is between 50 nm-200 nm.

Figure 20:
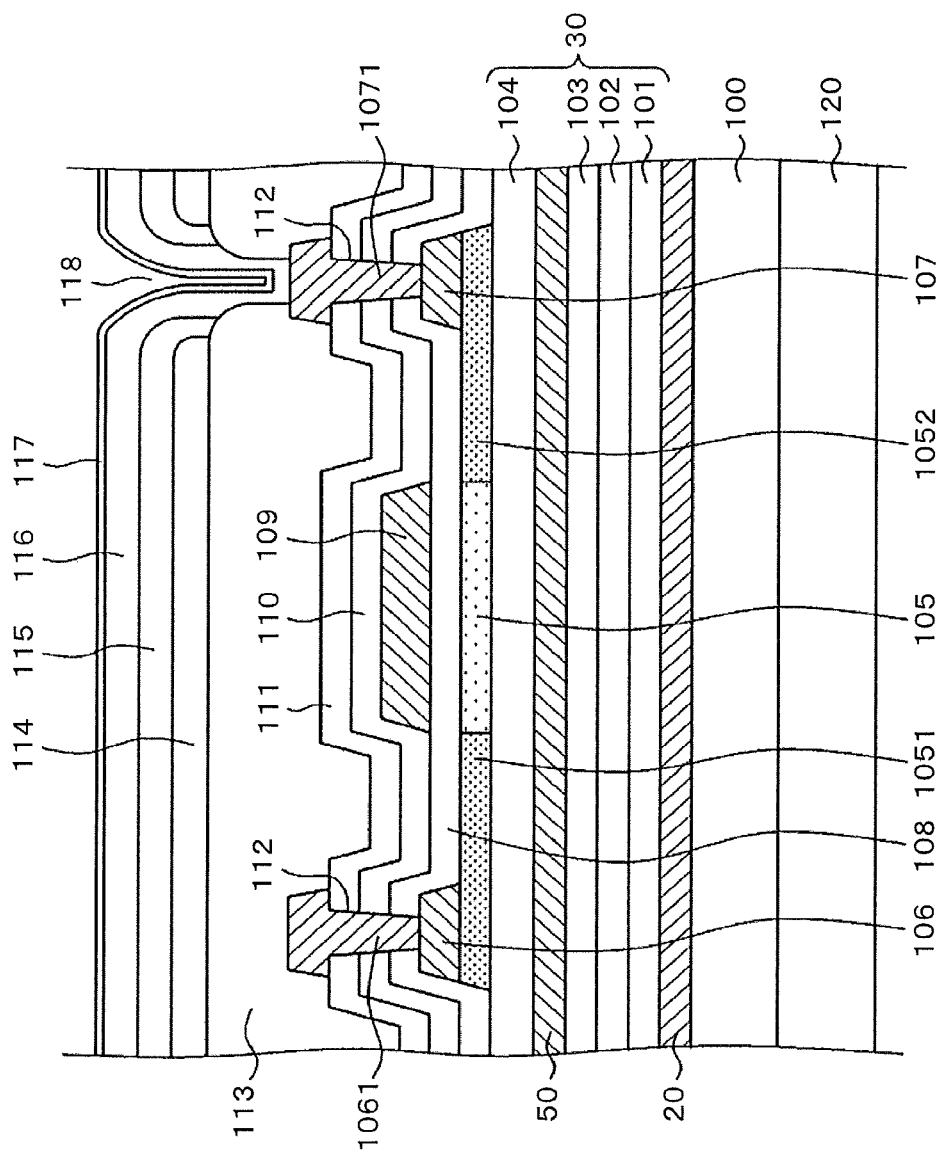
FIG. 20 is a cross sectional view of another aspect of the second embodiment.

FIG. 20 is another aspect of the second embodiment. FIG. 20 differs from FIG. 18 in that the second infra-red light reflection film 50 is formed by ITO that transmits the visible light. In FIG. 20, the ITO as the second infra-red light reflection film 50 is transparent, thus, it can be formed on all over the TFT substrate 100 or the display area 500. Therefore, since the infra-red light is reflected from all over the TFT substrate 100 by the first infra-red light reflection film 20 and by the second infra-red light reflection film 50, the TFT substrate 100 of polyimide is protected from the infra-red light thoroughly. On the other hand, the oxide semiconductor 105 is heated from the back, too, by reflected light from the first infra-red light reflection film 20 and the second infra-red light reflection film 50; therefore, the oxide semiconductor 105 is annealed at higher temperature.

The thickness of the ITO for the second infra-red light reflection film 50 is also between 50 nm-200 nm. The characteristics of the ITO for the second infra-red light reflection film 50 are the same as explained in the first embodiment. The ITO of the second infra-red light reflection film 50 is preferably formed by sputtering as the ITO of the first infra-red light reflection film 20. The reason is the same as explained in the first embodiment for the first infra-red light reflection film 20. In FIG. 20 of the present aspect of the second embodiment, the thickness of the third under coat 103 is approximately 500 nm and the thickness of the fourth undercoat 104 is approximately 300 nm as the same as FIG. 18. The reason is the same as explained at FIG. 18.

As described above, according to the present embodiment, at least at the area the oxide semiconductor 105 is formed, the infra-red light is reflected twice at the first infra-red light reflection film 20 and the second infra-red light reflection film 50, thus, the oxide semiconductor 105 is efficiently heated and thoroughly annealed. If the second infra-red light reflection film 50 is formed by a transparent material to the visible light, the whole surface of the polyimide substrate 100 is protected from the infra-red light by the second infra-red light reflection film 50, too; thus, degradation of the polyimide substrate 100 can be avoided.

Third Embodiment

Figure 21:
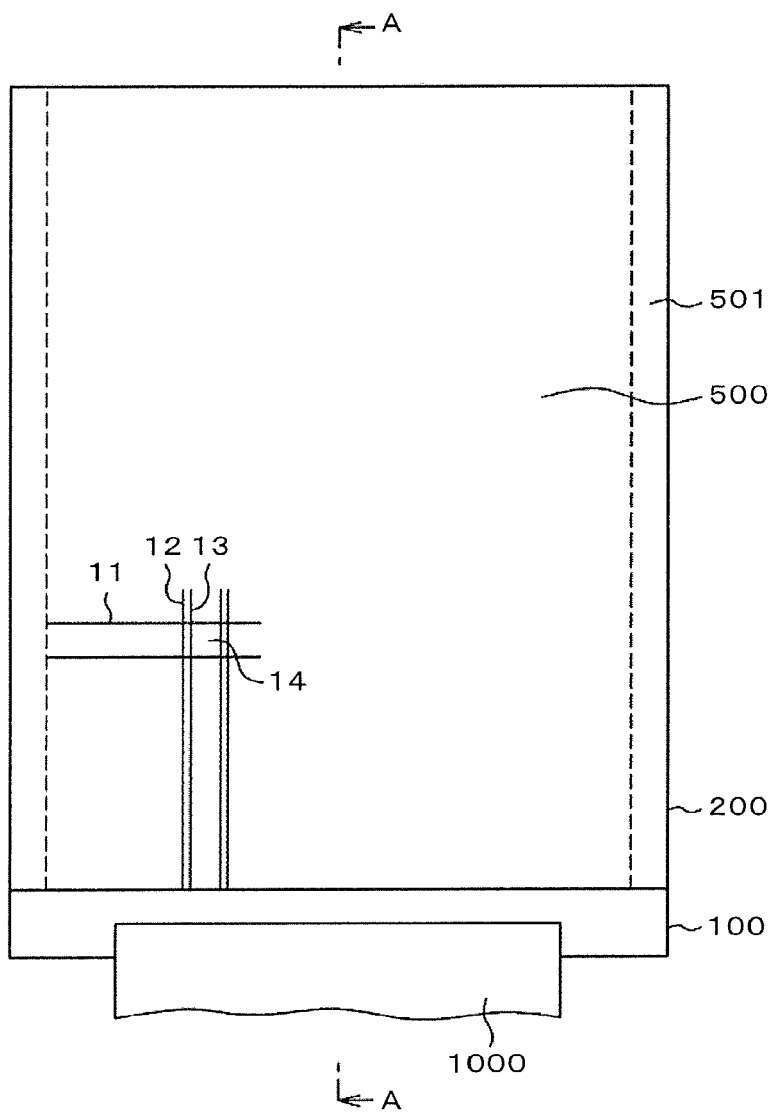
FIG. 21 is a plan view of the organic EL display device.

In the first embodiment and in the second embodiment, the present invention was explained in the case of the liquid crystal display device. The present invention is applicable to the organic EL display device, too. FIG. 21 is a plan view of the organic EL display device. In FIG. 21, the scanning lines 11 extend in lateral direction and arranged in longitudinal direction in the display area 500. A pairs of the video signal line 12 and the power line 13 extend in longitudinal direction and arranged in lateral direction. The pixel 14 is formed in the area surrounded by the scanning lines and pairs of the video signal line 12 and the power line 13. The scanning line driving circuit 501 is formed at both sides of the display area 500; the flexible wiring 1000 is connected to the terminal area to supply the power or the signals to the display device.

Figure 22:
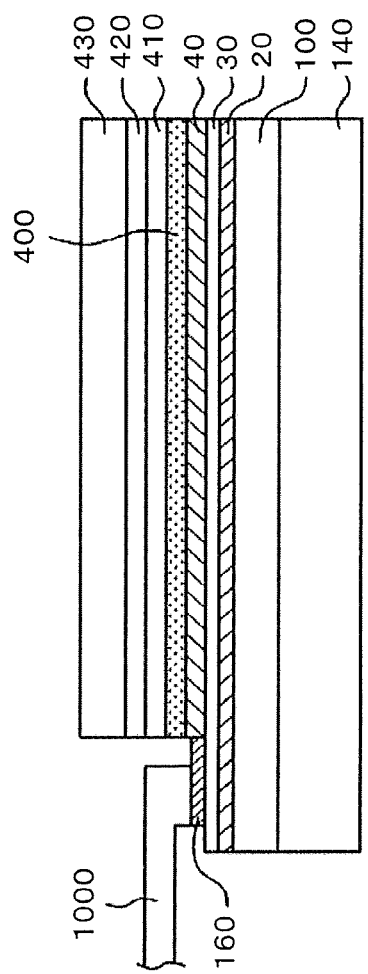
FIG. 22 is a cross sectional view of the EL display device according to the present invention.

FIG. 22 is cross sectional view along the line B-B of FIG. 21. In FIG. 22, the TFT substrate is formed by the polyimide. The infra-red light reflection film 20 of e.g. the ITO is formed on the polyimide substrate. The undercoat 30 is formed on the infra-red light reflection film 20. The array layer 40, which includes TFTs formed by the oxide semiconductors 105, is formed on the undercoat 30.

The organic EL layer 400, which includes the light emitting layer, is formed on the array layer 40. The organic EL layer 400 has a structure as that: plural layers of the organic EL layer are formed on the lower electrode; the he lower electrode includes the reflection electrode and the ITO that works as the cathode; the upper electrode is formed on the organic EL layer; the upper electrode, which is made by a transparent electrode, works as an anode.

The protective layer 410, formed by a laminated film of an inorganic layer of e.g. SiN layer and an organic layer of e.g. acrylic layer, is formed on the organic EL layer 400. The purpose of the protective layer 410 is to protect the organic EL layer 400 from moisture and, at the same time, to protect mechanically the organic EL layer 400. The circularly polarizing plate 420 is adhered to the protective layer 410. The circularly polarizing plate 420 prevents the images from being deteriorated by reflection of the external light. The protective film 430 is adhered to the circularly polarizing plate 420. On the other hand the supporting plate 140 is adhered to the TFT substrate 100 formed by polyimide. Since the polyimide substrate 100 and other layers are thin, it tends to be inconvenient to handle; in that case, the supporting substrate 140 is used. On the contrary, if the organic EL display device is used as a flexible display device, the supporting plate 140 is omitted.

As shown in FIG. 22, the TFT substrate 100 is formed by the polyimide; the TFTs including the oxide semiconductors 105 are formed in the array layer 40; therefore, there exists a dilemma that necessity of annealing the oxide semiconductor at high temperature and preventing the polyimide from heat damage as explained in the first embodiment and second embodiment. The dilemma in the organic EL display device also can be solved by forming the infra-red light reflection film 20 or 50 in the same structure as explained in the first embodiment and the second embodiment.

The structure from the TFT substrate 100 up to the organic passivation film 113 explained in FIG. 12 of the first embodiment is the same as in the organic EL display device, too. Therefore, forming the infra-red light reflection film 20 between the TFT substrate 100 and the first undercoat 101 enables thorough anneal for the oxide semiconductor 105 and preventing the polyimide substrate 100 from being excessively heated by the infra-red light.

There are two types of organic EL display device, namely, the bottom emission type where the light emits to the TFT substrate direction, and the top emission type where the light emits opposite direction to the TFT substrate. The top emission type is currently in a main stream since the emission area can be made bigger. In the top emission type, the light doesn't penetrate in the TFT substrate 100; consequently, there is no requirement that the infra-red light reflection film 20 must transmit the light. Thus, in addition to the ITO, other material as metal that doesn't transmit light can be utilized for the infra-red light reflection film 20. The examples of metals are Ti, Al, W, Mo, Cr or alloys of those metals, or a laminated film of those metals or metal alloys.

The structure of FIG. 18 and FIG. 20 explained in regard to the liquid crystal display device can be used in the organic EL display device. The reason is that the structure from the TFT substrate 100 to the organic passivation film 113 in the liquid crystal display device is the same in the organic EL display device. In other words, further improvement is possible using both the first infra-red light reflection film 20 and the second infra-red light reflection film 50.

In the case of the top emission type, since the light doesn't go to the direction to the TFT substrate, the opaque metal or alloy or laminated film of those metals or alloys can be used for the first infra-red light reflection film 20 and the second infra-red light reflection film 50.

As described above, in the organic EL display device, too, setting the first infra-red light reflection film 20 or the second infra-red light reflection film 50 enables to anneal thoroughly the oxide semiconductor 105 and to prevent the polyimide substrate 100 from being excessively heated.

In the first embodiment through third embodiment, the first infra-red light reflection film 20 exists between the TFT substrate and the first undercoat 101. However, the first infra-red light reflection film 20 does not necessarily exist between the TFT substrate and the first under coat 101; it can be set between the undercoats. In other words, an under coat of SiO or an under coat of SiN can exists between the first infra-red light reflection film 20 and the TFT substrate formed by the polyimide.

What is claimed is:
1. A display device comprising:
a substrate formed by resin, a first inorganic insulating film, a second inorganic insulating film and a thin film transistor including a semiconductor,
wherein a first infra-red light reflecting film is formed between the substrate and the first inorganic insulating film,
a second infra-red light reflecting film is formed between the first inorganic insulating film and the second inorganic insulating film, the second inorganic insulating film is formed between the second infra-red light reflecting film and the thin film transistor.

2. The display device according to claim 1, a reflectivity of the first infra-red light reflecting film to an infra-red light of a wave length of a 2 μm is 75% or more, and a reflectivity of the second infra-red light reflecting film to an infra-red light of a wave length of a 2 μm is 75% or more.

3. The display device according to claim 1, the first infra-red light reflecting film covers all of a display area.

4. The display device according to claim 1, the first infra-red light reflecting film is formed by ITO.

5. The display device according to claim 1, the second infra-red light reflecting film covers all of a display area.

6. The display device according to claim 1, the second infra-red light reflecting film is fainted by ITO.

7. The display device according to claim 1, the second infra-red light reflecting film overlaps with a channel of the TFT in a plan view, and does not overlap all of a display area.

8. The display device according to claim 7, the second infra-red light reflecting film overlaps with a channel of the TFT in a plan view, and does not overlap entirety of a display area.

9. The display device according to claim 7, the second infra-red light reflecting film is mono layer or multi layered film composed of a metal film or an alloy film.

10. The display device according to claim 1, wherein the resin is polyimide.

* * * * *